US006898776B1

United States Patent
Jacobson et al.

(10) Patent No.: US 6,898,776 B1
(45) Date of Patent: May 24, 2005

(54) METHOD FOR CONCURRENTLY PROGRAMMING A PLURALITY OF IN-SYSTEM-PROGRAMMABLE LOGIC DEVICES BY GROUPING DEVICES TO ACHIEVE MINIMUM CONFIGURATION TIME

(75) Inventors: Neil G. Jacobson, Mountain View, CA (US); Emigdio M. Flores Jr., Coral Springs, FL (US); Sanjay Srivastava, San Jose, CA (US); Bin Dai, Mountain View, CA (US); Sungnien Jerry Mao, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 359 days.

(21) Appl. No.: 10/162,008

(22) Filed: Jun. 3, 2002

(51) Int. Cl.[7] .............................................. G06F 17/50
(52) U.S. Cl. ......................................... 716/16; 716/17
(58) Field of Search ......................... 716/1–17; 326/38, 326/39, 4

(56) References Cited

U.S. PATENT DOCUMENTS

| | | | | |
|---|---|---|---|---|
| 5,519,633 A | * | 5/1996 | Chang et al. .................. 716/19 |
| 5,635,855 A | | 6/1997 | Tang | |
| 5,838,954 A | * | 11/1998 | Trimberger ................... 716/16 |
| 5,999,014 A | * | 12/1999 | Jacobson et al. .............. 326/38 |
| 6,184,713 B1 | * | 2/2001 | Agrawal et al. .............. 326/41 |
| 6,714,040 B1 | * | 3/2004 | Jacobson et al. .............. 326/38 |

* cited by examiner

*Primary Examiner*—Vuthe Siek
*Assistant Examiner*—Binh Tat
(74) *Attorney, Agent, or Firm*—Patrick T. Bever; Edel M. Young; Lois Cartier

(57) ABSTRACT

A method for concurrently programming a series of in-system devices by grouping the devices into sequentially-programmed groups, wherein a best possible grouping of devices is determined that achieves a minimum total configuration time. When a system includes multiple devices, it is sometimes more efficient (i.e., requires less total configuration time) to program the devices in two or more groups, as compared to programming all of the devices at the same time (i.e., as a single group). The method utilizes device information to identify an optimal or best grouping by comparing the total configuration times of several possible groupings, and selecting the grouping having the lowest total configuration time. Once a best grouping is determined, programming is performed by selecting a first group from the grouping and programming the first group while bypassing devices all other groups. Once the first group is programmed, a next group is programmed, and so on.

13 Claims, 6 Drawing Sheets

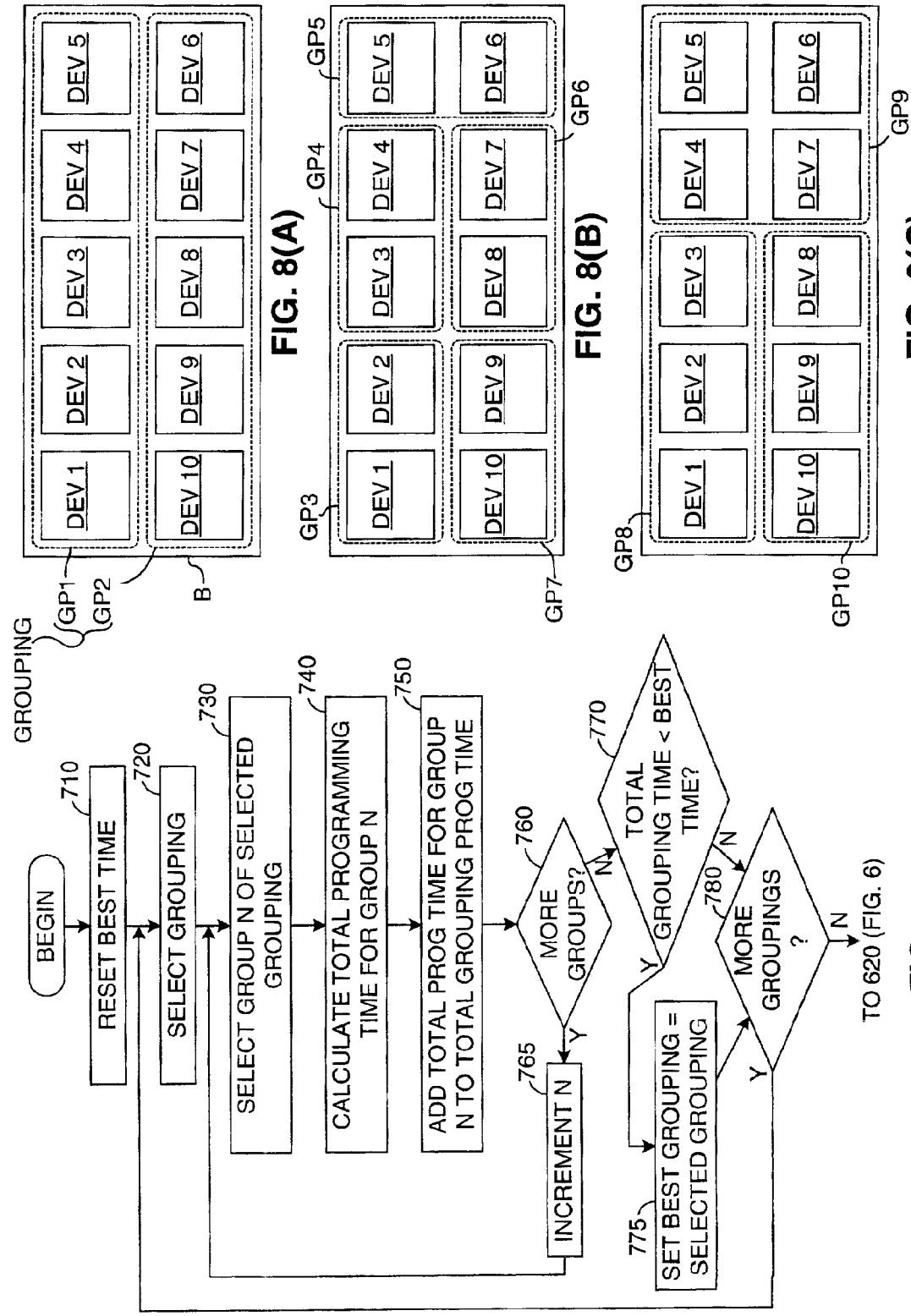

METHOD FOR CONCURRENTLY PROGRAMMING A PLURALITY OF IN-SYSTEM-PROGRAMMABLE LOGIC DEVICES BY GROUPING DEVICES TO ACHIEVE MINIMUM CONFIGURATION TIME

FIELD OF THE INVENTION

The present invention relates generally to the field of programmable logic devices and more particularly to an improved method for effecting operations on a plurality of in-system programmable complex programmable logic devices (CPLDs).

BACKGROUND OF THE INVENTION

IEEE Standard 1149.1 and 1a entitled IEEE Standard Test Access Port and Boundary-Scan Architecture, published Oct. 21, 1993 by the IEEE under ISBN 1-55937-350-4 relates to circuitry that may be built into an IC device to assist in testing the device as well as testing the printed circuit board on which the device is placed. In particular, the standard provides for testing IC devices connected on a standard control bus in series (commonly referred to as a daisy chain).

FIG. 1 shows a structure comprising three devices, controlled by four signals, a test data input signal TDI applied to DEVICE 1, a test data output signal TDO applied by DEVICE 1 to DEVICE 2 and chained through DEVICE 3, a test mode select signal TMS, and a test clock signal TCK. This structure complies with IEEE Standard 1149.1. A data output port TDO from one device is connected to the data input port TDI of the next device to create the daisy chain. All data and instructions for all devices are loaded into the data input port of the first device in the chain.

The test mode select signal TMS and the clock signal TCK control a 16-state state machine shown in FIG. 2 that is within the IC device, which meets IEEE Standard 1149.1, and controls shifting in of the data. On each rising edge of clock signal CLK, the state of test mode select signal TMS is inspected by a state machine within the IC device. (Such state machines are well known and are not discussed here.) FIG. 2 shows movement through the states based on the TMS signal at the rising edge of CLK. As shown in FIG. 2, five consecutive high (logic 1) TMS signals place the state machine into STATE 1, the Test-Logic Reset state. From there, a single low signal or a continuous low signal places the state machine into STATE 2, the Run-Test Idle state in which no action occurs but from which action can be initiated more quickly.

Loading data into the data registers of the devices will now be discussed. From STATE 2 (FIG. 2), a single logic 1 moves the state machine to STATE 3, the Select-DR-Scan state, which is a path select state from which loading of data registers can be initiated. One logic 0 signal initiates STATE 4, from which initializing data are loaded in parallel from an internal register. Next, a logic 0 signal initiates STATE 5, the Shift-DR state, which is held by logic 1 TMS signals while serial data are shifted into a shift register or registers. After serial shifting of data, a logic 1 followed by logic 0 causes a pause at STATE 7. Another 10 returns to STATE 5 for more loading of serial data. Following STATE 5 or STATE 7, two logic 1's initiate STATE 9 in which the appropriate data registers are actually updated. While the state machine is in STATE 9, data that have been shifted into the IC are latched into the data registers on the falling edge of TCK. From here, continuous high signals return the state machine to STATE 1, the Test-Logic Reset state, and continuous low signals return to STATE 2, the Run-Test Idle state.

Loading instruction data into the instruction registers of the devices will now be discussed. From STATE 2, two logic 1 signals prepare for capturing instructions into the instruction register by moving the state machine to STATE 10, the Select-IR-Scan state. A logic 0 then initiates STATE 11, the Capture-IR state, and a logic 0 then initiates STATE 12 in which instruction data are shifted into the instruction register while the TMS signal remains at logic 0. State 14 allows for a pause in the shifting of instructions into the instruction register, and STATE 16 causes the actual latching of the instructions into the instruction register, on the falling edge of TCK. Once the new instruction has been latched, it becomes the current instruction.

Programming, erasing, or reading back data from the devices will now be discussed. Some CPLD devices are programmed by a nonvolatile means such as EPROM cells or flash cells (transistors). Generally, these devices can be programmed using the IEEE standard discussed above. The programming step involves raising voltages at certain transistor gates to a high level and maintaining the high level until sufficient charge has flowed onto or away from a floating gate of the transistor to cause the transistor to maintain a certain state when the high voltage is removed. Typically, a stream of data from ten to several hundred bits long can be shifted into several devices in less time than is required to program a transistor (cell) in a device. Thus a practical and widely used programming procedure is to serially shift an instruction and then a unit of programming data through a daisy chain of devices (STATEs 5 and 12 of FIG. 2) and then move into a programming mode (usually occurs in STATE 2 of FIG. 2 when entered from STATE 9 or STATE 16) during which all addressed EPROM, EEPROM, or flash transistors (cells) are programmed simultaneously as specified by the programming data. This method is practical and efficient when all devices in the daisy chain are the same size and have the same requirements for programming time and programming voltage. However, the devices are often unequal in size.

One prior art method for programming a daisy chain of devices having unequal size is disclosed in U.S. Pat. No. 5,635,855 to Tang. Tang discloses a method for simultaneously programming a plurality of in-system programmable devices connected in series. If three devices are to be programmed and the three are of unequal size, Tang teaches a method by which all three devices are programmed simultaneously until the first is done, and the remainder continue until they are also done (see Tang FIG. 9). Such a method can be used to significantly reduce the programming, erase and readback times as compared to accessing each device in sequence, especially for a large number of devices. Tang's method is satisfactory when all such devices have programmable cells which are accessed (programmed, erased, or read back) in about the same amount of access time and which are substantially free of programming omissions or otherwise do not require retries. However, Tang's method is not compatible with IEEE Standard 1149.1 and also is not the optimum method when the devices have unequal access times (wait periods). The wait period is the time that it normally takes a programmable device to respond to programming data by altering its cell states (for programming and erase operations) or indicating its cell states (for a read back operation) and then generating an output signal indicating completion of that process. Since the wait period is typically much longer than the time required to input programming data, the wait period for a device is the principal factor in the overall time required to program a device.

Typically, devices having larger numbers of programmable cells can generate programming voltages more quickly and therefore have shorter wait periods for programming a cell or set of cells than devices having smaller numbers of programmable cells because of the internal cell overhead. Thus, a large device that is, say, eight times as large as a smaller device will not take eight times as long to program.

If the programming of all devices is done based upon the longest wait period, the time needed to program all of the devices is made longer than necessary. However, if a shorter wait period is used, programming of devices with the longer wait times will not be performed properly. Thus there is a need to provide an improvement that accommodates serially connected devices having different wait periods and cell numbers while simultaneously reducing the overall time of programming the devices.

Another prior art method that addresses the problem mentioned above is disclosed in U.S. Pat. No. 5,999,014 to Jacobson et al (Jacobson '014). Jacobson '014 discloses a method for concurrently accessing in-system PLDs for program, erasure or readback, and accommodates retries to assure completion of programming even when the initial attempt is not entirely successful. According to the method disclosed in Jacobson '014, where there are devices having different numbers of programmable memory cells, and whose memory cells require different wait periods to carry out programming, the method provides for programming only the devices requiring programming at the rate required by the slowest of the devices requiring programming. For example, referring again to FIG. 1, assume DEVICE 1 includes 500 addresses (#A=500), each address having a programming time TP=200 ms, where TP is the time required to program one address location. DEVICE 1 also includes a four-bit data register 11 (RL=4) that stores shifted-in data for programming into a group of four bits associated with a selected address A0–A499 of DEVICE 1 includes four bits that are written from a four-bit data register 11. Further, DEVICE 1 includes an instruction register 12 for storing instructions shifted in the boundary scan chain. Assume also that DEVICE 2 has 1000 addresses, a TP=100 ms and an eight-bit data register 21, and that DEVICE 3 has 2000 macrocells, a TP=50 ms, and a sixteen-bit data register 31. DEVICES 2 and 3 have instruction registers similar to instruction register 12. The number of addresses defines the logic capacity of the PLD.

In accordance with the method disclosed by Jacobson '014, since DEVICE 1 is the slowest of the three and requires 200 ms to program, programming initially occurs for 200 ms. That is, configuration data is shifted into the data registers 11, 21, and 31 of each of the three devices, and then programming is performed for 200 ms. This data shifting and programming is repeated until programming of the slowest device (i.e., DEVICE 1) is completed. When the programming of the slowest device is completed, the programming rate is increased to the next slowest device that still has addresses to program (i.e., DEVICE 2), and maintained at this programming rate until programming of the next slowest device is completed. Finally, when all slower devices have been programmed, the programming rate increases to that of the fastest device (i.e., DEVICE 3), which is typically the device having the largest number of programmable cells, until programming is completed.

Although the method disclosed by Jacobson '014 generally provides for better throughput, it is not true that arbitrary application of this methodology results in optimal throughput. For instance, concurrently accessing devices with very long programming burn times along with devices having very short programming burn times may not be efficient. In addition, if the time it takes to shift in the data is very close to the programming burn time, there may be little benefit to using the concurrent approach disclosed by Jacobson '014. In other words, when it comes to concurrent programming in a heterogeneous device environment, one size does not fit all.

What is needed is an improved method of concurrently accessing in-system PLDS for program, erasure or readback that optimizes programming times by taking into account the programming burn times and data shift times.

SUMMARY OF THE INVENTION

The present invention is directed to a method for concurrently programming a series of in-system devices by grouping the devices into sequentially-programmed groups, and in particular to a method in which a best-possible grouping of devices is determined that achieves a most effective total configuration time before programming is commenced. The present inventors have determined that when a system includes multiple devices, it is sometimes more efficient (i.e., requires less total configuration time) to program the devices in two or more groups, in comparison to programming all of the devices at the same time (i.e., as a single group).

The present invention provides a method for determining an optimal or best grouping that achieves a most effective configuration time by comparing the total configuration times of several possible groupings, and selecting the grouping having the best (smallest) total configuration time. Once a best grouping is determined, programming is performed by selecting a first group from the grouping and programming the first group while bypassing devices of all other groups. Once the first group is programmed, a next group is programmed, and so on, until all of the groups are programmed.

Because the calculations associated with determining the best grouping typically require much less time than the actual programming process, the total programming time for programming several systems having identical device arrangements is greatly reduced, thereby reducing total manufacturing costs.

In accordance with an embodiment of the present invention, the method utilizes a cost function to determine a best grouping of the in-system logic devices that produces a most effective concurrent configuration time. Specifically, each grouping includes two or more groups, each group having one or more devices. All devices of the system (or board) are included in each grouping. The cost function takes into account the number of bits (addresses) to be configured, the data register length, and the programming latency (or burn) time for each device to calculate the total programming time for each grouping. The number of programming latency breaks per device may also be used. In one example, the cost function calculates the total programming time for each group, and then adds the total times for each group to calculate the total programming time for the grouping. The grouping time is then compared with a best time calculated using a previous grouping. If the current total group time is better (i.e., requires less total programming time) than that of the best time, then the currently selected grouping replaces the previous grouping as the best grouping. After a series of groups are calculated and compared (e.g., when all possible grouping combinations are analyzed), programming proceeds with the grouping that is identified as the best (i.e., the optimal grouping selected from all possible groupings, or the "best" grouping, selected from a subset of all possible groupings, that requires the least amount of programming time).

Note that the optimal grouping may result in some devices being programmed sequentially (i.e., in a group of one), while other devices of the system are programmed as a group.

In accordance with another aspect of the present invention, a similar method is optionally utilized to optimize device erasure or pattern verification times.

BRIEF DESCRIPTION OF THE DRAWINGS

These and other features, aspects and advantages of the present invention will become better understood with regard to the following description, appended claims, and accompanying drawings, where:

FIG. 7 is a flow diagram showing a method for grouping devices in accordance with an embodiment of the present invention;

FIGS. 8(A), 8(B), and 8(C) are diagram showing exemplary groupings of devices of the system board of FIG. 4;

DETAILED DESCRIPTION OF THE DRAWINGS

Figure 3:
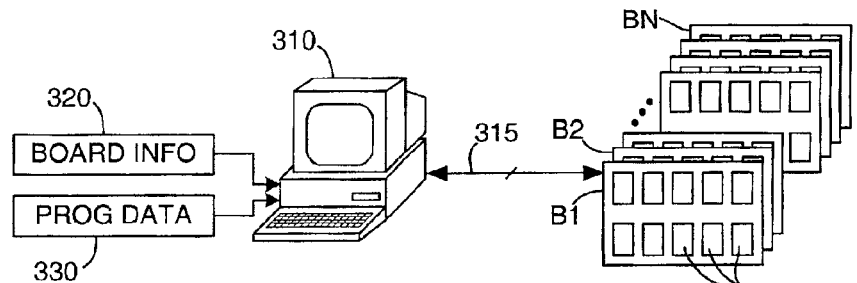
FIG. 3 is a simplified block diagram showing an arrangement for programming devices in accordance with the present invention.

FIG. 3 is a simplified block diagram showing an arrangement for programming devices mounted on a plurality of system boards B1 through BN in accordance with the present invention. Each system board B1–BN includes an identical set of devices D mounted thereon that are connected in compliance with IEEE Standard 1149.1, as discussed further below. The arrangement includes a computer or work station 310 for performing the device grouping and programming functions described below. In particular, computer 310 receives board/device information 320 and programming data 330 from an external source according to known techniques. Board/device information 320 identifies each device D on boards B1–BN, and includes information necessary to perform the grouping function. Programming data 330 includes data streams that are transmitted to devices D of boards B1–BN during a programming function over a Boundary-Scan bus 315.

Figure 2:
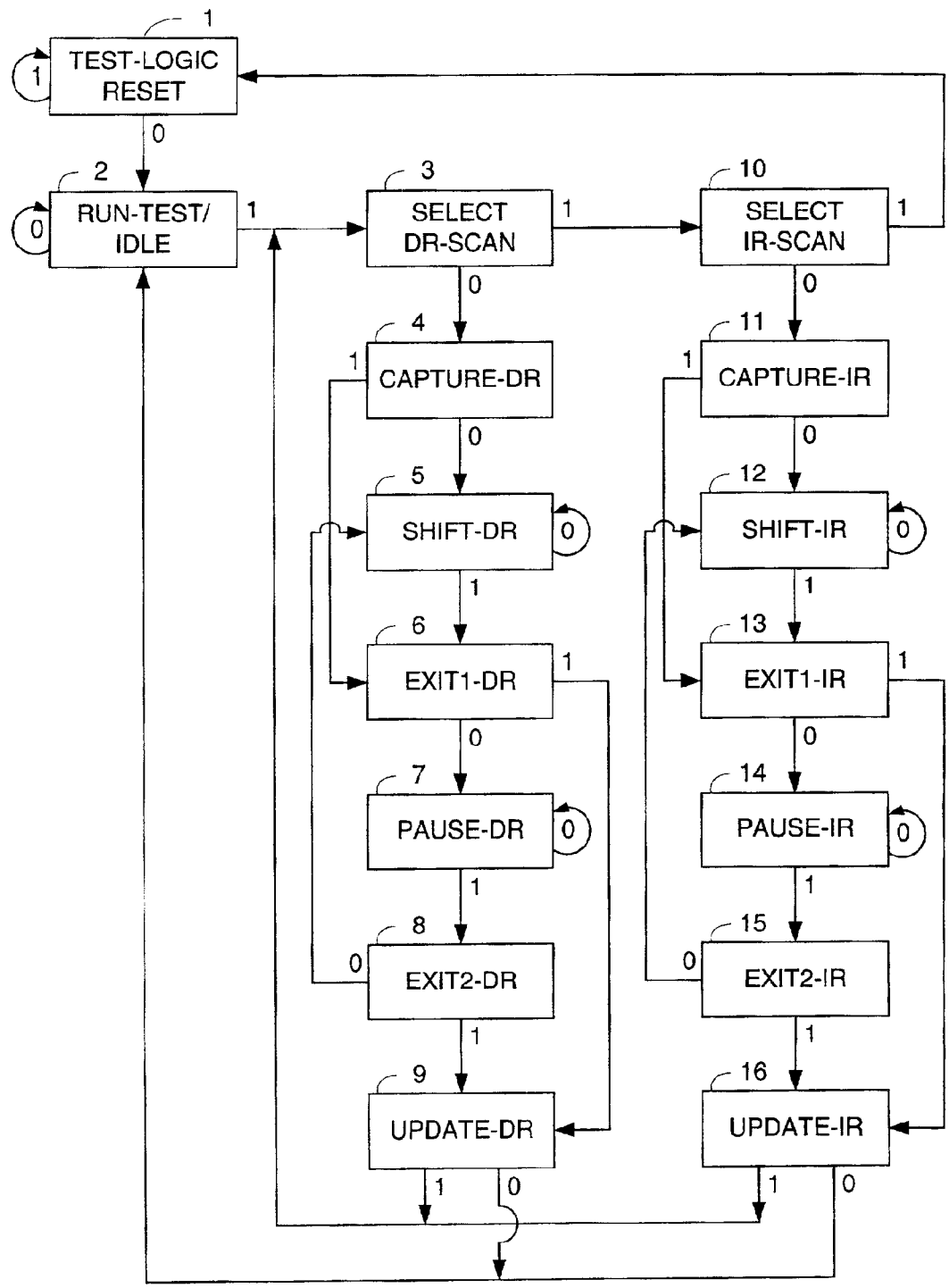
FIG. 2 shows the TAP controller state machine controlled by TMS and TCK signals according to the IEEE Standard 1149.1.
Figure 4:
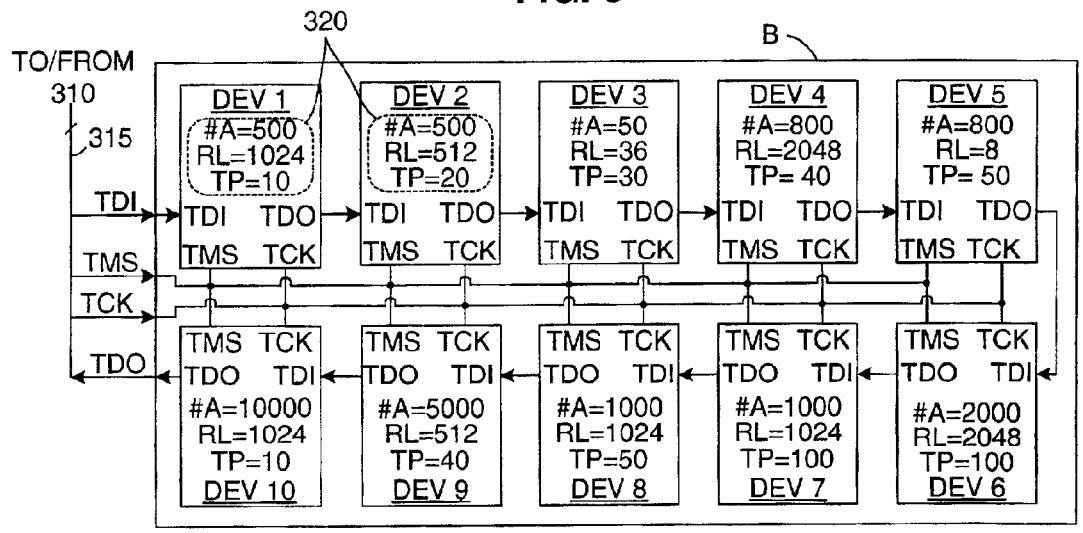
FIG. 4 is a simplified block diagram showing an exemplary arrangement of devices mounted on a system board.

FIG. 4 shows an exemplary board B that is identical to each board B1–BN of FIG. 3. Board B includes ten devices DEV 1 through DEV 10, which are connected to receive four signals from bus 315: a test data input signal TDI, a test data output signal TDO, a test mode select signal TMS, and a test clock signal TCK. Devices DEV 1 through DEV 10 are connected in compliance with IEEE Standard 1149.1 to pass programming and/or test signals between the devices of board B and computer 310 (see FIG. 3) during programming operations. In particular, programming data and/or instruction data are transmitted from one device to the next device to create the daisy chain. Each device is controlled in accordance with the state machine described above with reference to FIG. 2.

As indicated in FIG. 4, each device DEV 1 through DEV 10 is characterized by device information 320 that is utilized during the device grouping and programming functions of the present invention. For example, device DEV 1 includes 500 addresses (#A=500) of programmable cells, a register length of 1024 (RL=1024), and a program (burn) time of 10 microseconds (TP=10). Similarly, device DEV 2 includes 500 addresses (#A=500), a register length of 512 (RL=512), and a program (burn) time of 20 microseconds (TP=20). The programming data of each of the other devices DEV 3 through DEV 10 is indicated in FIG. 4. Note that system connections that facilitate communications between devices DEV 1 through DEV 10, which are utilized during "normal" operation of board B, are omitted from FIG. 4 for brevity.

Figures 5, 6:
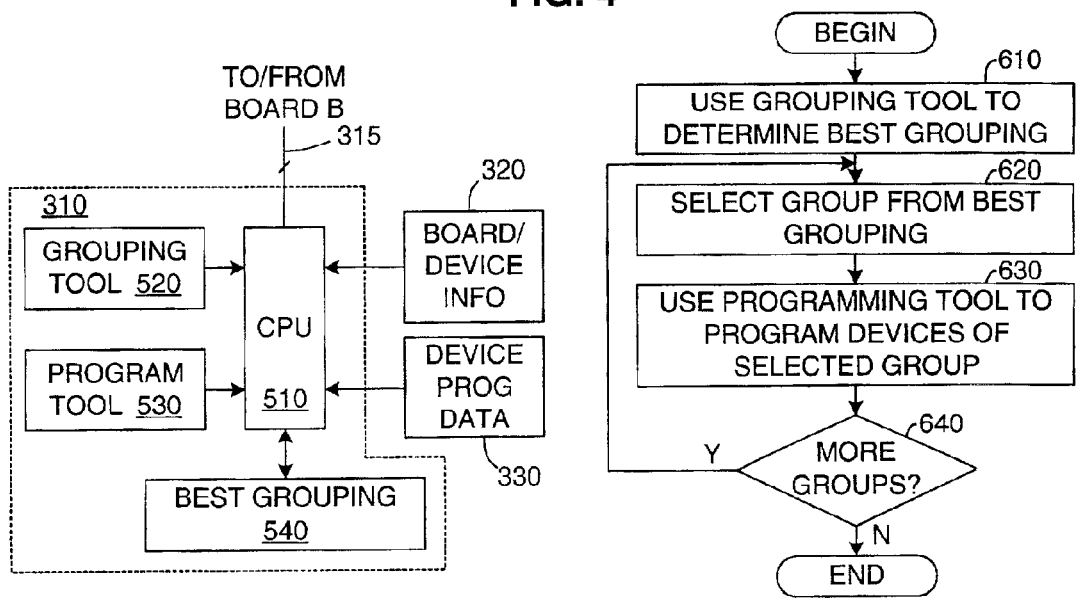
FIG. 5 is a simplified block diagram showing a system for programming devices in accordance with an embodiment of the present invention.
FIG. 6 is a flow diagram showing a method for programming devices in accordance with an embodiment of the present invention.

FIG. 5 is a simplified block diagram showing computer 310 in additional detail. As mentioned above, computer 310 incorporates a central processing unit (CPU) 510 that is controlled by instructions provided by a grouping tool 530 to perform the device grouping function of the present invention, and a programming tool 530 for performing programming functions in accordance with the present invention.

FIG. 6 is a flow diagram showing a method for operating computer 310 to program the devices of a system, such as devices DEV 1 through DEV 10, in accordance with the present invention.

As indicated at the top of FIG. 6, the method begins by utilizing grouping tool 520 (FIG. 5) to determine a best grouping for subsequent programming (block 610). In particular, grouping tool 520 is loaded into CPU 510 according to known techniques, and is then operated in conjunction with device information 320 to determine a best grouping of in-system devices DEV 1 through DEV 10 that produces a most effective total configuration time.

As used herein, the noun "grouping" is used to mean a set of groups of programmable devices wherein every device is included in one group. The phrase "best grouping" describes a grouping selected from a global set of analyzed groupings that, when its groups are sequentially programmed, requires the least amount of programming time. Note that, when a large number of devices are included in a system, it may not be practical to analyze every possible grouping combination, so the best grouping may be selected from a subset of all possible groupings. An "optimal grouping" is a best grouping identified from all possible grouping combinations.

FIG. 7 is a flow diagram showing an exemplary grouping process performed when block 610 is called in FIG. 6. First, a best time value is reset to a predetermined large value (block 710). Next, a grouping is selected in accordance with a predetermined procedure (block 720). Grouping selection is discussed in detail below. Once a grouping is selected, a first group is chosen from the grouping (block 730), and the device information for the devices in the selected group is used to calculate the total programming time for the selected group (block 740).

Note that the calculation of programming time takes into account the programming process to be utilized during the programming function. In one embodiment, the programming time is calculated in accordance with the programming operation described below with reference to FIGS. 9–11. After calculating the programming time for the selected group, the calculated programming time is added to a total grouping programming time (block 750), which is reset for each grouping. This calculation process is repeated for each group until a programming time is calculated for every group (NO in block 760), thereby providing a total grouping programming time for the selected grouping. Next, this total grouping programming time is compared with the best time (block 770), and the selected grouping replaces a previously established best grouping if the total grouping programming time is less than the best time (block 775). The process is then repeated for each grouping generated in block 720 until all possible or predetermined groupings are analyzed. In this manner, a best grouping is identified from the set of groupings provided in block 720 by comparing the programming time for each grouping, and identifying the grouping that requires the lowest amount of programming time.

As mentioned above, several possible methods may be used to generate groupings in block 720 (FIG. 7). One simple method would be to simply group a predetermined number of devices in each group. For example, exemplary groupings of devices DEV 1 through DEV 10 of a board B (discussed above) are shown in FIG. 8(A) (five devices per group) and FIG. 8(B) (two devices per group). In particular, FIG. 8(A) shows a first grouping that includes two groups GP1 and GP2, with group GP1 including devices DEV 1 through DEV 5, and group GP2 including devices DEV 6 through DEV 10. FIG. 8(B) shows a second grouping that includes five groups GP3 through GP7, with group GP3 including devices DEV 1 and DEV 2, GP4 including devices DEV 3 and DEV 4, GP5 including devices DEV 5 and DEV 6, GP6 including devices DEV 7 and DEV 8, and group GP8 including devices DEV 9 and DEV 10. Note that the groups of a grouping do not necessarily have the same number of devices. For example, FIG. 8(C) shows a third grouping in which groups GP8 and GP10 have three devices each, and group GP9 has four devices. Note further that the devices in each group need not be connected in sequence. For example, a group may include devices DEV 1, DEV 3, and DEV 7. Those of ordinary skill in the art will recognize that several algorithms may be utilized to form groupings conducive to identifying an optimal (or best) grouping for the purposes of the present invention.

Figure 1:
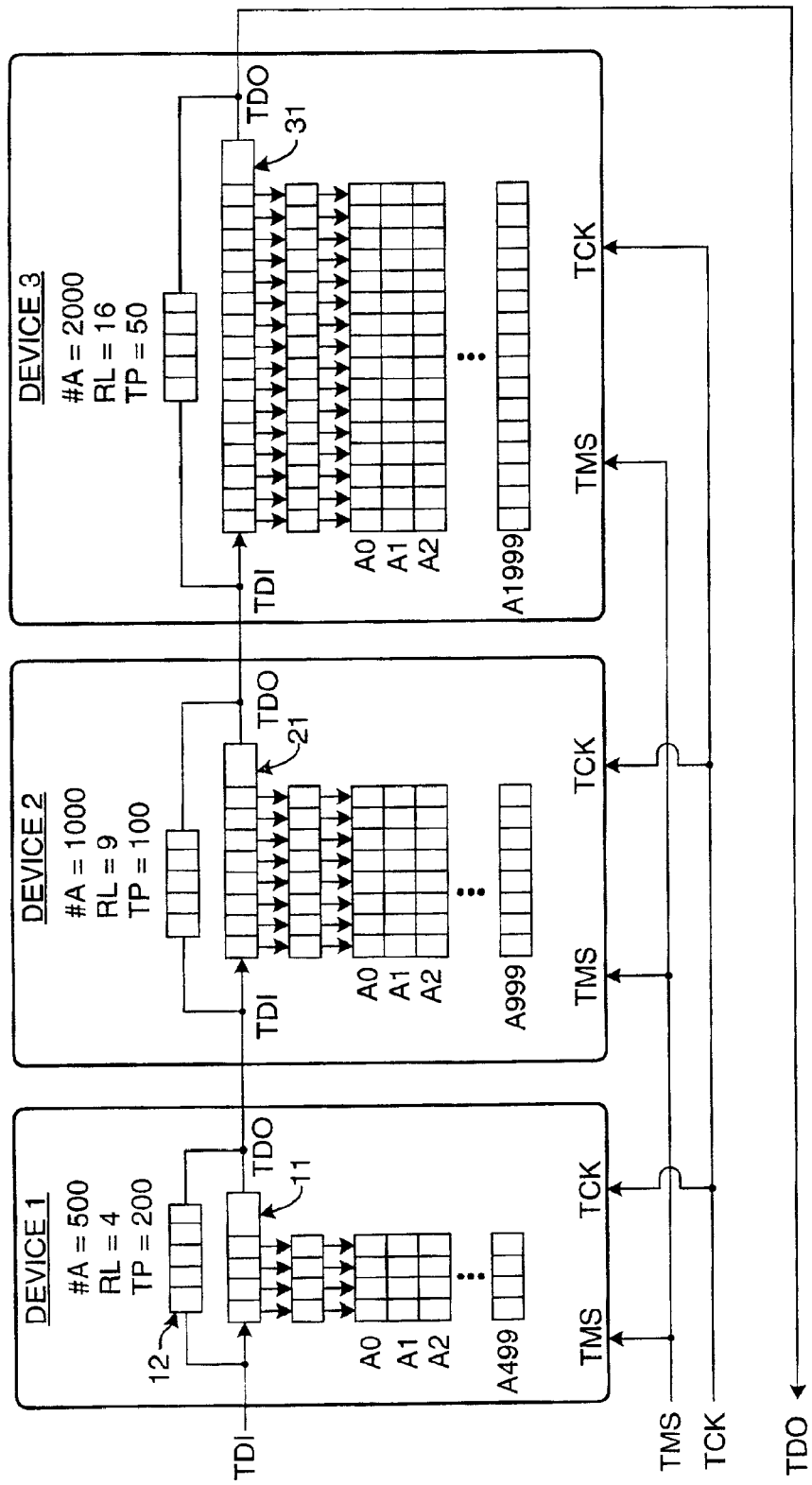
FIG. 1 is a block diagram showing a simplified system including three programmable logic devices.

As mentioned above, the calculated total programming time (block 740; FIG. 7) is typically consistent with the programming process ultimately utilized to program each system (e.g., boards B1–BN; FIG. 1). In one embodiment, a cost function is utilized in which a total programming time for each group is calculated using a number of addresses to be configured in each device, a data register length for each device, and the programming latency time for each device. The methodology is iterative and guided by selecting better groupings based on the return value of the cost function. One possible methodology can be described as follows: 1) Group devices with similar sized burn times (sec in one group, msec in another group, usec in a third group, etc.); 2) In each burn time group, collect devices with similar total number of addresses to configure; 3) In each burn time/address group add a device to the group as long as the bit streaming rate (in bits per second) multiplied by the number of bits to shift per program operation multiplied by an efficiency factor (e.g., 10) is less than the maximum burn time of the devices in the group; and 4) Repeat 3) to create groups.

Another approach is to assign a direct cost factor to each device and then select devices to optimize the cost. One possible cost factor could be calculated as: Address Count*(ProgramBits*BitRate)+Address Count*(Burn Time). In this case the cost is measured in seconds. Additional devices add to the cost as follows:

Sum over all Devices $$\{MAX[Device(AddressCount)]*(Device(Program\ Bits)*Bit\ Rate)+MAX[Device(AddressCount)]*(MAX[Device(Burn\ Time)])\}$$

where MAX is the maximum of all devices considered. AddressCount is the total number of device address locations to program. The cost function may also calculate the total programming time for each grouping using a number of programming latency breaks per device. The problem then becomes a classical optimization problem of selecting device combinations to minimize this cost equation. Those of ordinary skill in the art will recognize that several methods other that the cost function examples provided above may be utilized to identify a best grouping from a set of groupings.

Referring again to FIG. 6, after a best grouping is determined, programming tool 530 (FIG. 5) is loaded into CPU 510, and programming is then performed by selecting a group from the best grouping (block 620), using programming tool 530 to program the selected group while bypassing all devices not in the selected group (block 630), and then repeating the group selection and programming process until all of the groups (devices) are programmed (block 640). The programming function performed in block 630 is described in additional detail below with reference to FIGS. 9 through 11.

Figures 9, 10:
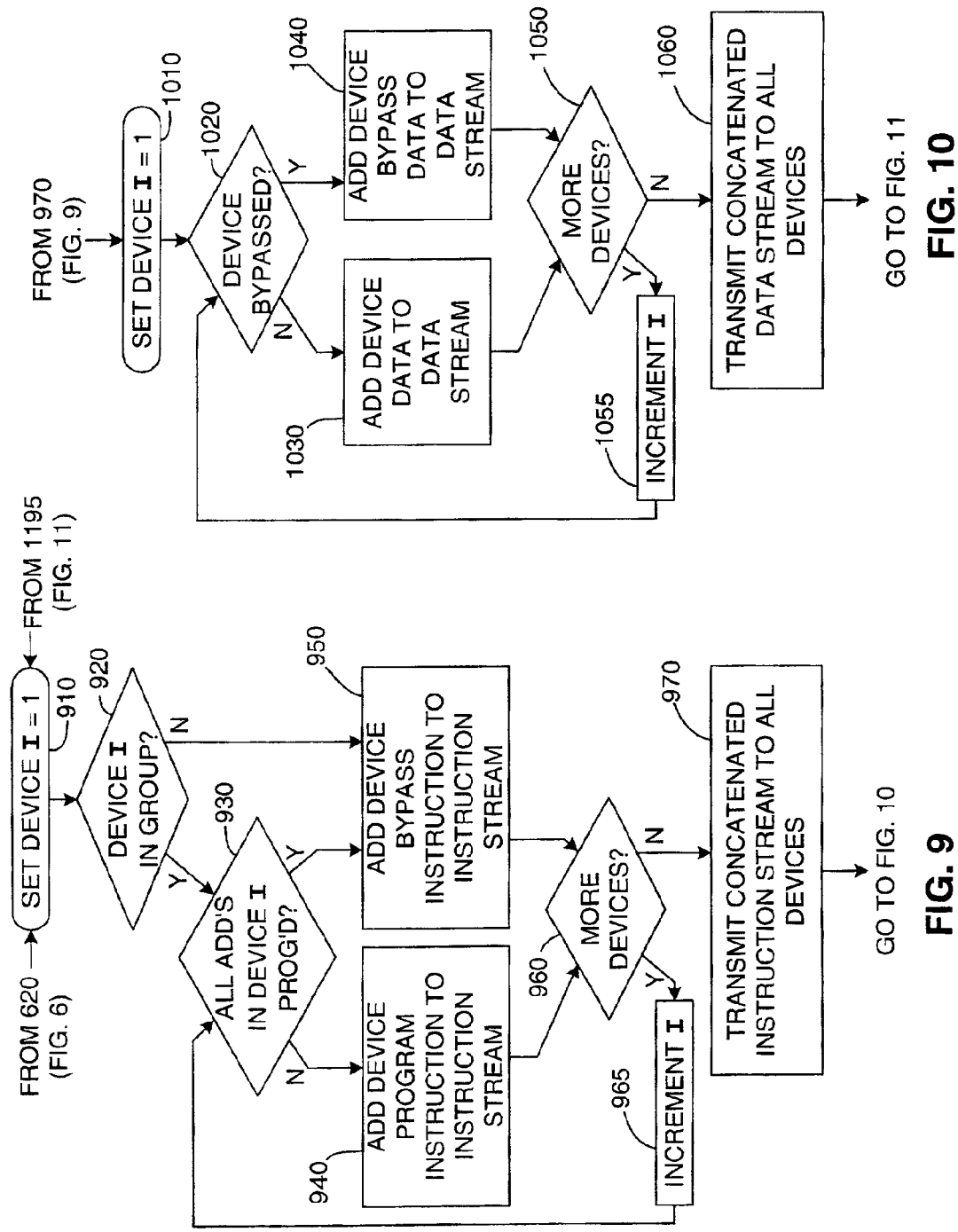
FIG. 9 is flow diagram showing a method for passing instruction data to a selected group of devices in accordance with an embodiment of the present invention.
FIG. 10 is flow diagram showing a method for passing programming data to a selected group of devices in accordance with an embodiment of the present invention.

FIG. 9 shows the flow for forming the instruction stream to be loaded through the daisy chain on lines TDI and TDO (FIG. 4) and loading the instruction stream into devices DEV 1 through DEV 10. In FIG. 9, the instruction stream is formed and transmitted to all devices. As described above with reference to FIG. 2, the instructions transmitted to each device control whether that device is to be programmed, read from, erased, or bypassed, and also control test operations as defined by IEEE Standard 1149.1.

As shown in FIG. 9, after resetting variable I to one (block 910), the programming process begins by determining whether the device I (i.e., DEV 1 initially, and DEV 2 through DEV 10 as I increments) is in the selected group. If not, then a bypass instruction is added to the current instruction stream for that device (block 950). If the device I is in the selected group, then an initial step in shifting instruction data for either program, erase or read output is determining whether or not the active address space for device I has been exhausted (block 930). If it has not been exhausted, at block 940 the device access instruction is added to the current instruction stream. If it has been exhausted, at block 950 the device bypass instruction is added to the current instruction stream. By incrementing I at block 960, this process of adding bits to the instruction stream is repeated for all of the interconnected devices until block 960 indicates there are no more devices. Then at block 970 the concatenated instruction stream is transmitted to all devices.

After instructions have been shifted into position in the instruction registers of devices DEV 1 through DEV 10, a data loading mode occurs for loading data and programming a current address in the device.

FIG. 10 shows steps for shifting data into the devices. After re-initializing variable I (block 1010), the process begins by determining whether all addresses in DEV 1 have been programmed, or whether device DEV 1 is not in the selected group, by checking whether the device is bypassed. If not, at block 1030 device data are added to the data stream. If yes, at block 1040 device bypass data are added to the data stream. This process is repeated for each device (blocks 1050 and 1055). After block 1050 indicates all devices for which an address is unprogrammed have had data added to the data stream, at block 1060 the data are transmitted through the ten devices so that the devices of the selected group can be programmed.

Recall that if a device is not in the selected group, or if programming of a device of the selected group is completed, as shown in FIG. 9, a bypass instruction will have been added to the instruction stream. Only one bit of bypass data need be added to the data stream for devices that are fully programmed or otherwise bypassed. As data are being loaded into one address, data are being shifted out from a previous address. In one preferred embodiment, the first two bits of data shifted in for each device identify whether the input data are to be operated on, and the first two bits shifted out are status bits that indicate whether programming was successful for the previous data. In other embodiments, status bits may not be included, or may be used for other purposes.

Figure 11:
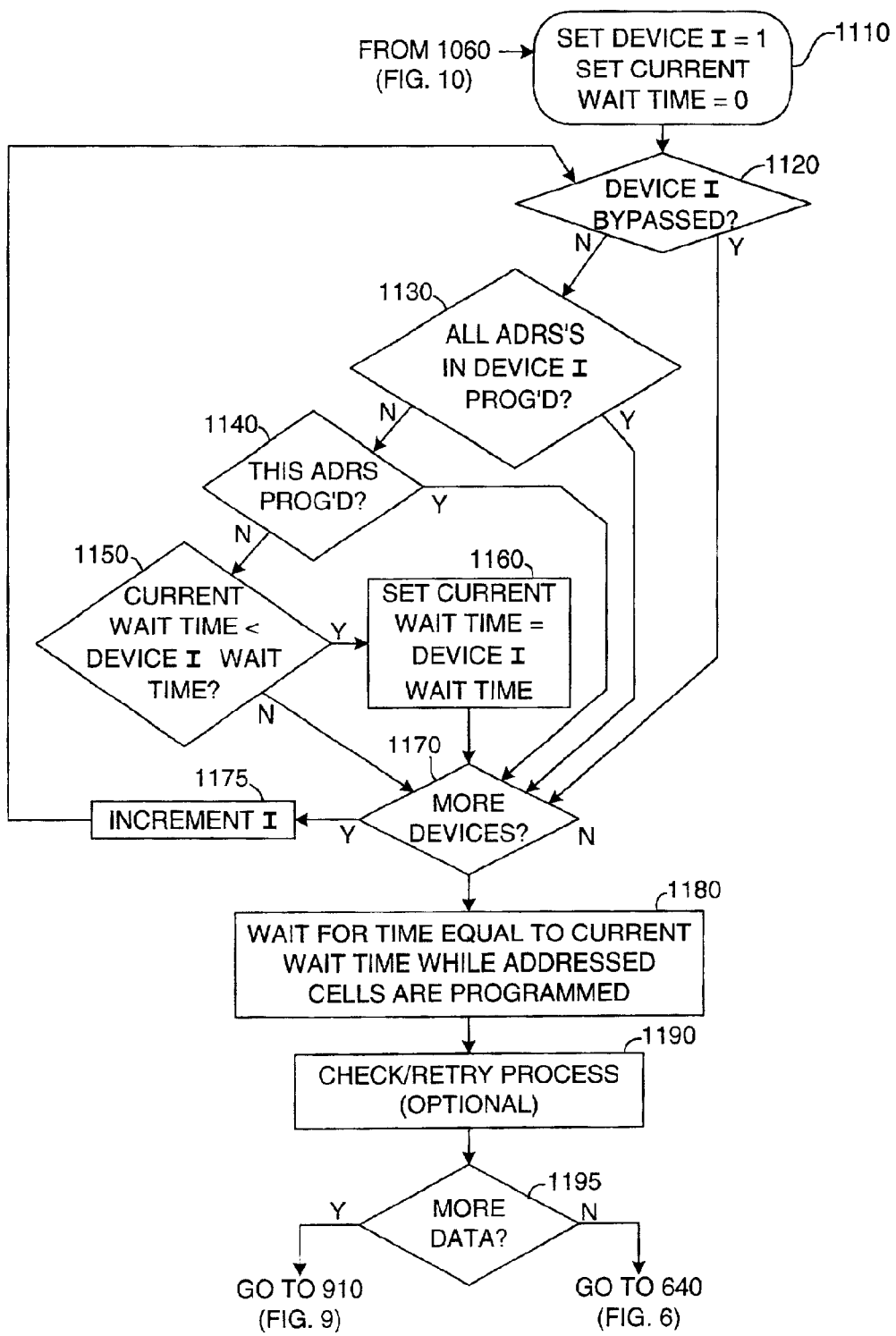
FIG. 11 is flow diagram showing a method for selecting a programming wait time used to program a selected group of devices in accordance with an embodiment of the present invention.

As shown in FIG. 11, a programming step occurs next. Another step in the improved inventive method of the present invention is determining and applying programming voltages for an appropriate wait time. Programming is accomplished by the following steps. First, at block 1110 it is assumed that the initial condition is a zero wait time for device I=1. In block 1120, if the address space for I=1 is not yet exhausted, and if in block 1140 the current address has not yet been successfully programmed, at block 1150, the current wait time will be compared to the wait time (TP, or burn time) of the first device in the selected group. The current wait time (i.e. 0) will, of course, be less than that of the first device to be programmed, so that at block 1160, the current wait time will be set equal to the wait time of the first device.

By cycling through blocks 1170 and 1175 as necessary, wait times of the other devices that are in the selected group and with unexhausted address space are then compared. At block 1170, after there are no more devices for wait times to be examined, the process stops and waits for a time equal to the finally determined wait time while the addressed cells are programmed (block 1180). In this manner, the wait time for N devices in the selected group will always be set to the longest wait time of the N devices which still have unexhausted address space. This provides the shortest possible wait times during the entire programming process even as the smaller and slower devices become fully programmed.

Next, in block 1190, one or more optional retry operations may be utilized for checking and retransmitting the program data (if programming is determined to be unsuccessful for the transmitted data). Several such retry procedures are disclosed in Jacobson '014, cited above and incorporated herein by reference. Finally, in block 1195, the process of sending instructions and program data is repeated (i.e., control returns to block 910, FIG. 9) if programming of the selected group is not yet completed (i.e., if program data still needs to be sent to one or more devices of the selected group), and control passes to block 640 (FIG. 6) if programming of all devices of the selected group is completed.

Referring again to FIG. 6, after completing the programming of the selected group, the process returns to block 640 and a second (or next) group of devices is selected from the best grouping (block 620), and then the programming process described above with reference to FIGS. 9–11 is repeated for this next group (block 630). The selection of a group and programming of the selected group is repeated until all groups of the grouping are programmed (No in block 640). Note that because each device of the system is included in one group of the best grouping, all of the devices are programmed when the programming process is completed.

Note that when several identical systems are to be programmed, such as boards B1–BN (FIG. 1), the grouping function performed in block 610 need be performed only once, while blocks 620 through 640 are repeated for each system (board). Accordingly, once a best grouping is determined using, for example, the process shown in FIG. 7, programming is performed on one or more systems using the best grouping generated in the grouping process of FIG. 7. Because the calculations associated with determining the best grouping typically require much less time than the actual programming process, the total programming time for programming several Systems having identical device arrangements, such as boards B1–BN (FIG. 1), is greatly reduced, thereby reducing total manufacturing costs.

In accordance with another embodiment of the present invention, a method similar to that used during programming is optionally utilized to optimize device erasure or pattern verification times.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A method for concurrently programming a plurality of in-system logic devices, the method comprising:

(a) utilizing a cost function to determine a best grouping of said in-system logic devices that produces a most effective concurrent configuration time, wherein utilizing the cost function comprises calculating a total programming time for each grouping using a number of addresses to be configured in each device, a data register length for each device, and the programming latency time for each device;

(b) selecting a group from the best grouping;

(c) programming the devices of the selected group while bypassing all devices associated with non-selected groups; and repeating (b) and (c) until all of the plurality of in-system logic devices are fully programmed.

2. The method according to claim 1, wherein utilizing the cost function further comprises calculating the total programming time for each grouping using a number of programming latency breaks per device.

3. The method according to claim 1, wherein utilizing the cost function comprises utilizing the cost function to calculate a total programming time for each group of a grouping, and then adding the total programming times for each group of the grouping to calculate the total programming time for the grouping.

4. The method according to claim 3, further comprising storing a best grouping and a best programming time, comparing the best programming time with the total programming time for each grouping, and replacing the best grouping with a selected grouping when the total programming time for the selected grouping is less than the best programming time.

5. The method according to claim 4, further comprising replacing the best programming time with the total programming time of the selected grouping.

6. The method according to claim 1, wherein utilizing the cost function comprises:

(a) grouping devices with similar sized burn times;

(b) in each burn time group, collecting devices with similar total number of addresses to configure;

(c) in each burn time/address group adding a device to the group as long as the bit streaming rate multiplied by the number of bits to shift per program operation multiplied by an efficiency factor is less than the maximum burn time of the devices in the group; and repeating step (c) to create the groups.

7. The method according to claim 1, wherein programming comprises:

(a) determining the longest wait time of all of the devices of the selected group having unexhausted address space;

(b) applying the longest wait time as the current wait time in programming the devices; and (c) repeating steps (a) and (b) until all of the devices are fully programmed.

8. A method for concurrently programming a plurality of in-system devices connected to a boundary scan chain, the method comprising:

(a) grouping the plurality of devices into a plurality of groups such that each device is assigned to only one group, including utilizing a cost function to determine a best grouping from a set of possible groupings such that the best grouping produces a total programming time, as determined by the cost function, that is less than total programming times of all other groupings in the set of possible groupings, wherein utilizing the cost function comprises calculating a total programming time for each grouping using a number of addresses to be configured in each device, a data register length for each device, and the programming latency time for each device;

(b) selecting a group from the grouping;

(c) programming the devices of the selected group while bypassing all devices associated with non-selected groups; and repeating (b) and (c) for each group of the grouping.

9. The method according to claim 8, wherein utilizing the cost function further comprises calculating the total programming time for each grouping using a number of programming latency breaks per device.

10. The method according to claim 8, wherein utilizing the cost function comprises utilizing the cost function to calculate a total programming time for each group of a grouping, and then adding the total programming times for each group of the grouping to calculate the total programming time for the grouping.

11. The method according to claim 10, further comprising storing the best grouping and a best programming time associated with the best grouping, comparing the best programming time with each subsequently calculated total programming time for each subsequent grouping, and replacing the best grouping with a selected grouping when the total programming time for the selected grouping is less than the stored best programming time.

12. The method according to claim 11, further comprising replacing the best programming time with the total programming time of the selected grouping.

13. A method for concurrently programming a plurality of in-system devices connected to a boundary scan chain, the method comprising:

(a) grouping the plurality of devices into a plurality of groups such that each device is assigned to only one group;

(b) calculating a total programming time needed to program all groups of the grouping, including calculating the total programming time using a number of addresses to be configured in each device, a data register length for each device, and the programming latency time for each device;

repeating (a) and (b) for a plurality of different groupings, and selecting a best grouping from the plurality of different groupings that has a lowest total programming time; and programming the plurality of devices by (c) selecting a group from the best grouping, (d) programming each device of the selected group while bypassing all other devices, and repeating (c) and (d) until all groups of the best grouping are programmed.

* * * * *